United States Patent
Chou

(10) Patent No.: US 12,191,651 B2
(45) Date of Patent: Jan. 7, 2025

(54) OVERCURRENT PROTECTION CIRCUIT, MEMORY STORAGE DEVICE AND OVERCURRENT PROTECTION METHOD

(71) Applicant: PHISON ELECTRONICS CORP., Miaoli (TW)

(72) Inventor: Shu-Han Chou, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 236 days.

(21) Appl. No.: 17/546,025

(22) Filed: Dec. 8, 2021

(65) Prior Publication Data

US 2023/0127395 A1     Apr. 27, 2023

(30) Foreign Application Priority Data

Oct. 22, 2021   (TW) .................................. 110139203

(51) Int. Cl.
*H02H 3/08*        (2006.01)
*H02H 1/00*        (2006.01)
(Continued)

(52) U.S. Cl.
CPC ............ *H02H 3/08* (2013.01); *H02H 1/0007* (2013.01); *H03K 5/24* (2013.01)

(58) Field of Classification Search
CPC .. G05F 1/56; G05F 1/573; H02H 3/08; H02H 1/0007; H03K 5/24
(Continued)

(56) References Cited

U.S. PATENT DOCUMENTS

2003/0175560 A1*  9/2003  Kim .................... H02J 7/0031
                                                           429/61
2006/0133000 A1*  6/2006  Kimura ................ G05F 1/5735
                                                           361/93.1
(Continued)

FOREIGN PATENT DOCUMENTS

| CN | 104883162 | 9/2015 |
|----|-----------|--------|
| CN | 112835536 | 5/2021 |
| TW | 201310836 | 3/2013 |

OTHER PUBLICATIONS

"Office Action of China Counterpart Application", issued on Apr. 1, 2023, p. 1-p. 16.

(Continued)

*Primary Examiner* — Jared Fureman
*Assistant Examiner* — Lucy M Thomas
(74) *Attorney, Agent, or Firm* — JCIPRNET

(57) ABSTRACT

An overcurrent protection circuit, a memory storage device, and an overcurrent protection method are disclosed. The overcurrent protection circuit includes a load switch, a first mirror circuit, a second mirror circuit, and a control circuit. The first mirror circuit is configured to generate a first node voltage in a state that a voltage difference between two terminals of the load switch is within a first voltage region. The second mirror circuit is configured to generate a second node voltage in a state that the voltage difference between the two terminals of the load switch is within a second voltage region. The control circuit is configured to cut off the load switch according to at least one of the first node voltage and the second node voltage to perform an overcurrent protection. The first voltage region is different from the second voltage region.

27 Claims, 4 Drawing Sheets

(51) Int. Cl.
*H02H 9/02* (2006.01)
*H03K 5/24* (2006.01)

(58) Field of Classification Search
USPC ........................................... 361/93.1
See application file for complete search history.

(56) References Cited

U.S. PATENT DOCUMENTS

| | | | |
|---|---|---|---|
| 2012/0194147 A1* | 8/2012 | Socheat | G05F 1/575 |
| | | | 323/265 |
| 2013/0258530 A1* | 10/2013 | Nakahara | G01R 19/16571 |
| | | | 361/18 |
| 2016/0327602 A1* | 11/2016 | Subramanian | G01R 31/69 |
| 2017/0103788 A1* | 4/2017 | Levisse | H10B 61/00 |
| 2019/0050011 A1* | 2/2019 | Fujimoto | G05F 1/573 |

OTHER PUBLICATIONS

"Office Action of Taiwan Counterpart Application", issued on Aug. 15, 2022, p. 1-p. 10.

* cited by examiner

OVERCURRENT PROTECTION CIRCUIT, MEMORY STORAGE DEVICE AND OVERCURRENT PROTECTION METHOD

CROSS-REFERENCE TO RELATED APPLICATION

This application claims the priority benefit of Taiwan application serial no. 110139203, filed on Oct. 22, 2021. The entirety of the above-mentioned patent application is hereby incorporated by reference herein and made a part of this specification.

BACKGROUND OF THE INVENTION

Field of the Invention

The invention relates to an overcurrent protection technique, and particularly relates to an overcurrent protection circuit, a memory storage device, and an overcurrent protection method.

Description of Related Art

Generally speaking, overcurrent protection mechanism is achieved by monitoring the voltage difference between two terminals of a parasitic metal on the path through which current passes. When the voltage difference between the two terminals of the parasitic metal is higher than the preset value, it means that the current flowing through the specific electrical equipment is too large at this time. Excessive current (that is, overcurrent) may cause electrical equipment to heat up, catch fire, or cause loss of parts. However, the above method of monitoring the voltage difference between the two terminals of the parasitic metal is readily affected by a variety of external factors, such as process variations of the parasitic metal, changes in environmental temperature, and/or weak measured signal, thus resulting in a larger measurement error. Moreover, in order to overcome the shortcoming of weak measured signal, a more complex and accurate measurement circuit is often needed, thus leading to an increase in circuit layout area and cost.

SUMMARY OF THE INVENTION

Accordingly, the invention provides an overcurrent protection circuit, a memory storage device, and an overcurrent protection method that may improve the overcurrent protection efficiency of electrical equipment.

An exemplary embodiment of the invention provides an overcurrent protection circuit, including a load switch, a first mirror circuit, a second mirror circuit, and a control circuit. Two terminals of the load switch are respectively connected to a first voltage and a second voltage. The first mirror circuit is connected to the load switch. The second mirror circuit is connected to the load switch. The control circuit is connected to the load switch, the first mirror circuit, and the second mirror circuit. The first mirror circuit is configured to generate a first node voltage in a state that a voltage difference between the two terminals of the load switch is within a first voltage region. The second mirror circuit is configured to generate a second node voltage in a state that the voltage difference between the two terminals of the load switch is within a second voltage region. The control circuit is configured to cut off the load switch according to at least one of the first node voltage and the second node voltage to perform an overcurrent protection. The first voltage region is different from the second voltage region.

In an exemplary embodiment, the operation of the control circuit cutting off the load switch according to one of the first node voltage and the second node voltage includes: sending a control signal to the load switch in response to a voltage difference between one of the first node voltage and the second node voltage and a reference voltage being greater than a threshold value to cut off the load switch via the control signal.

In an exemplary embodiment of the invention, the first mirror circuit is configured to generate a first mirror current flowing through a first detection point in the state that the voltage difference between the two terminals of the load switch is within the first voltage region. The second mirror circuit is configured to generate a second mirror current flowing through a second detection point in the state that the voltage difference between the two terminals of the load switch is within the second voltage region. The first detection point is configured to detect the first node voltage. The second detection point is configured to detect the second node voltage.

In an exemplary embodiment of the invention, the first detection point is connected between the first voltage and a reference ground voltage. The second detection point is connected between the first voltage and the second voltage.

In an exemplary embodiment of the invention, the first mirror circuit includes a first impedance element. The second mirror circuit includes a second impedance element. The first impedance element is connected to the first detection point and configured to generate the first node voltage according to the first mirror current. The second impedance element is connected to the second detection point and configured to generate the second node voltage according to the second mirror current.

In an exemplary embodiment of the invention, the control circuit includes a first comparator and a second comparator. The first comparator is connected to the first mirror circuit and configured to compare the first node voltage with the reference voltage. The second comparator is connected to the second mirror circuit and configured to compare the second node voltage with the reference voltage.

In an exemplary embodiment of the invention, the control circuit further includes a first switch element and a second switch element. The first switch element is connected to the first comparator and the load switch and configured to generate a control signal in response to a first voltage difference between the first node voltage and the reference voltage being greater than a first threshold value, wherein the control signal is configured to cut off the load switch. The second switch element is connected to the second comparator and the load switch and configured to generate the control signal in response to a second voltage difference between the second node voltage and the reference voltage being greater than a second threshold value.

In an exemplary embodiment of the invention, the control circuit further includes an enabling circuit. The enabling circuit is connected to the first comparator and the second comparator. The enabling circuit is configured to send an enabling signal to the first comparator and the second comparator in response to a current flowing through the load switch being higher than a start value.

An exemplary embodiment of the invention further provides a memory storage device including a connection interface unit, a rewritable non-volatile memory module, a memory control circuit unit, and an overcurrent protection circuit. The connection interface unit is configured to be connected to a host system. The memory control circuit unit is connected to the connection interface unit and the rewritable non-volatile memory module. The overcurrent protection circuit is disposed in the connection interface unit, the rewritable non-volatile memory module, or the memory control circuit unit. The overcurrent protection circuit is configured to: generate a first node voltage in a state that a voltage difference between two terminals of the load switch is within a first voltage region, wherein the two terminals of the load switch are respectively connected to a first voltage and a second voltage; generate a second node voltage in a state that the voltage difference between the two terminals of the load switch is within a second voltage region; and cut off the load switch according to at least one of the first node voltage and the second node voltage to perform an overcurrent protection. The first voltage region is different from the second voltage region.

In an exemplary embodiment, the operation of the overcurrent protection circuit cutting off the load switch according to one of the first node voltage and the second node voltage includes: sending a control signal to the load switch in response to a voltage difference between one of the first node voltage and the second node voltage and a reference voltage being greater than a threshold value to cut off the load switch via the control signal.

An exemplary embodiment of the invention further provides an overcurrent protection method, configured to control a load switch. The overcurrent protection method includes: generating a first node voltage in a state that a voltage difference between two terminals of the load switch is within a first voltage region, wherein the two terminals of the load switch are respectively connected to a first voltage and a second voltage; generating a second node voltage in a state that the voltage difference between the two terminals of the load switch is within a second voltage region; and cutting off the load switch according to at least one of the first node voltage and the second node voltage to perform an overcurrent protection. The first voltage region is different from the second voltage region.

In an exemplary embodiment, the step of cutting off the load switch according to one of the first node voltage and the second node voltage includes: sending a control signal to the load switch in response to a voltage difference between one of the first node voltage and the second node voltage and a reference voltage being greater than a threshold value to cut off the load switch via the control signal.

In an exemplary embodiment of the invention, the step of generating the first node voltage in the state that the voltage difference between the two terminals of the load switch is within the first voltage region includes: generating a first mirror current flowing through a first detection point via a first mirror circuit in the state that the voltage difference between the two terminals of the load switch is within the first voltage region. The step of generating the second node voltage in the state that the voltage difference between the two terminals of the load switch is within the second voltage region includes: generating a second mirror current flowing through a second detection point via a second current mirror circuit according to a second current. The first detection point is configured to detect the first node voltage. The second detection point is configured to detect the second node voltage.

In an exemplary embodiment of the invention, the step of generating the first node voltage in the state that the voltage difference between the two terminals of the load switch is within the first voltage region further includes: generating the first node voltage via a first impedance element according to the first mirror current. The step of generating the second node voltage in the state that the voltage difference between the two terminals of the load switch is within the second voltage region further includes: generating the second node voltage via a second impedance element according to the second mirror current.

In an exemplary embodiment of the invention, the step of cutting off the load switch according to one of the first node voltage and the second node voltage to perform the overcurrent protection includes: comparing the first node voltage with the reference voltage via a first comparator; and comparing the second node voltage with the reference voltage via a second comparator.

In an exemplary embodiment of the invention, the step of cutting off the load switch according to one of the first node voltage and the second node voltage to perform the overcurrent protection further includes: generating a control signal via a first switch element in response to a first voltage difference between the first node voltage and the reference voltage being greater than a first threshold value, wherein the control signal is configured to cut off the load switch; and generating the control signal via a second switch element in response to a second voltage difference between the second node voltage and the reference voltage being greater than a second threshold value.

In an exemplary embodiment of the invention, the overcurrent protection method further includes: sending an enabling signal to the first comparator and the second comparator via an enabling circuit in response to a current flowing through the load switch being higher than a start value.

Based on the above, the first mirror circuit may generate the first node voltage in the state that the voltage difference between two terminals of the load switch is within the first voltage region. The second mirror circuit may generate the second node voltage in the state that the voltage difference between the two terminals of the load switch is within the second voltage region. The first voltage region is different from the second voltage region. The control circuit may cut off the load switch according to at least one of the first node voltage and the second node voltage to perform the overcurrent protection. Accordingly, compared with the traditional method of monitoring the voltage difference between the two terminals of the parasitic metal on the path of the current, the overcurrent protection efficiency of the electrical equipment may be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

A plurality of exemplary embodiments are presented below to illustrate the invention, but the invention is not limited to the plurality of exemplary embodiments illustrated. Also, suitable combinations are allowed between the exemplary embodiments. The term "connection" used in the entire text of the specification of the present application (including claims) may refer to any direct or indirect connection means. For example, if the text describes a first device is connected to a second device, then it should be understood that the first device may be directly connected to the second device, or the first device may be indirectly connected to the second device via other devices or certain connection means. In addition, the term "signal" may refer to at least one current, voltage, charge, temperature, data, or any other one or a plurality of signals.

Figure 1:
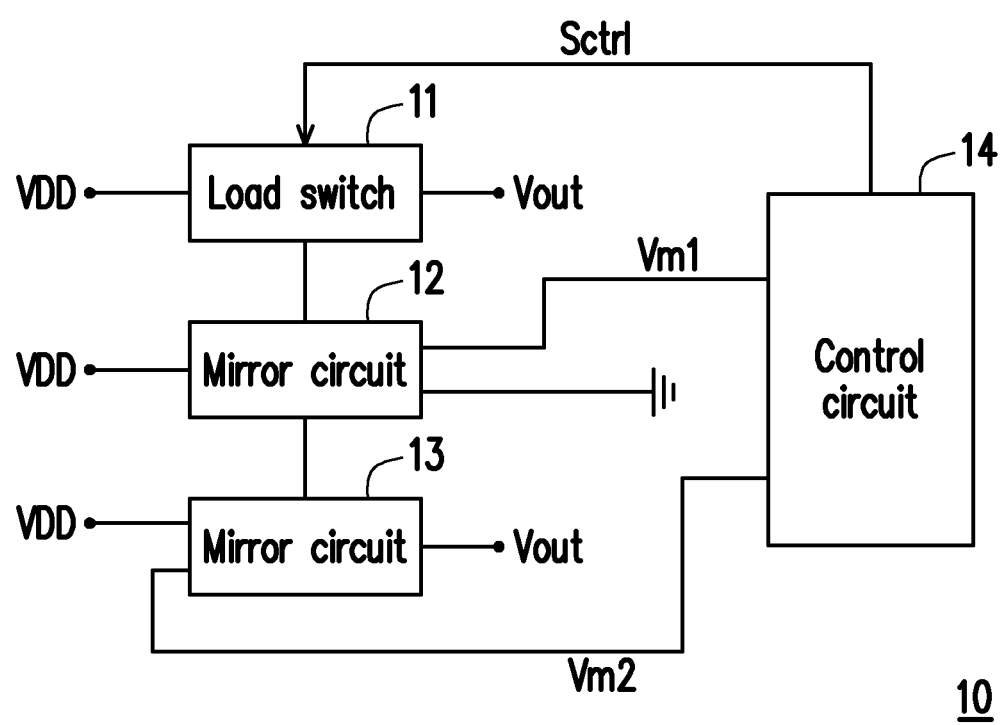
FIG. 1 is a schematic diagram of an overcurrent protection circuit shown according to an exemplary embodiment of the invention.

FIG. 1 is a schematic diagram of an overcurrent protection circuit shown according to an exemplary embodiment of the invention. Referring to FIG. 1, an overcurrent protection circuit 10 includes a load switch 11, a mirror circuit (also referred to as a first mirror circuit) 12, a mirror circuit (also referred to as a second mirror circuit) 13, and a control circuit 14. One terminal of the load switch 11 is connected to a drive voltage (also referred to as a first voltage) VDD. Another terminal of the load switch 11 is connected to an output voltage (also referred to as a second voltage) Vout. The load switch 11 may be configured to cut off or turn on the current path between the two terminals of the load switch 11 (that is, the drive voltage VDD and the output voltage Vout).

In an exemplary embodiment, when it is not detected that there is an overcurrent in the current flowing through the load switch 11 (for example, a current with a current value not greater than a preset value), the overcurrent protection circuit 10 may control the load switch 11 to maintain the current path between the two terminals of the load switch 11 in an on state, so that the current may pass through the load switch 11 smoothly. In an exemplary embodiment, when it is detected that there is an overcurrent in the current flowing through the load switch 11 (for example, a current with a current value greater than a preset value), the overcurrent protection circuit 10 may start the overcurrent protection. After the overcurrent protection is started, the overcurrent protection circuit 10 may control the load switch 11 to cut off the current path between the two terminals of the load switch 11 to prevent current from passing through the load switch 11.

The mirror circuits 12 and 13 are both connected to the load switch 11. The mirror circuit 12 is configured to perform the overcurrent protection of the load switch 11 in a specific voltage region (also referred to as a first voltage region). The mirror circuit 13 is configured to perform the overcurrent protection of the load switch 11 in another voltage region (also referred to as a second voltage region). The first voltage region is different from the second voltage region.

In an exemplary embodiment, the first voltage region may cover a portion of the voltage range between the drive voltage VDD and the reference ground voltage. The second voltage region may cover another portion of the voltage range between the drive voltage VDD and the reference ground voltage. The first voltage region and the second voltage region may at least partially not be overlapped. For example, assuming that one reference voltage (also referred to as a third voltage) is k volts, and k is between 0 and VDD, then the voltage range covered by the first voltage region may be between the drive voltage VDD and k volts, and the voltage range covered by the second voltage region may be between (the drive voltage VDD-k) and the reference ground voltage (for example, 0 volts). The reference ground voltage is also called reference grounding. For example, assuming that the drive voltage VDD is 5 volts, k is 1, and the reference ground voltage is 0 volts, then the first voltage region may be 5 volts to 1 volt, and the second voltage region may be 4 (5−1=4) volts to 0 volts.

In an exemplary embodiment, the mirror circuit 12 may generate a node voltage (also referred to as a first node voltage) Vm1 in a state that the voltage difference $\Delta V$ ($\Delta V$=VDD−Vout) between the two terminals of the load switch 11 is within the first voltage region. The mirror circuit 13 may generate a node voltage (also referred to as a second node voltage) Vm2 in a state that the voltage difference $\Delta V$ between the two terminals of the load switch 11 is within the second voltage region. The control circuit 14 is connected to the load switch 11, the mirror circuit 12, and the mirror circuit 13. The control circuit 14 is configured to turn off the load switch 11 according to at least one of the node voltages Vm1 and Vm2 to perform the overcurrent protection.

In an exemplary embodiment, the control circuit 14 may determine whether the voltage difference between one of the node voltages Vm1 and Vm2 and one reference voltage is greater than one threshold value. In response to the voltage difference between at least one of the node voltages Vm1 and Vm2 and the reference voltage being greater than the threshold value, the control circuit 14 may send a control signal Sctrl to the load switch 11 to cut off the load switch 11 via the control signal Sctrl. For example, in response to the control signal Sctrl, the load switch 11 may cut off the current path between the two terminals of the load switch 11 to perform the overcurrent protection. Moreover, in response to the voltage difference between any one of the node voltages Vm1 and Vm2 and the reference voltage is not greater than the threshold value, the control circuit 14 does not need to send the control signal Sctrl to the load switch 11.

In an exemplary embodiment, the mirror circuit 12 is connected between the drive voltage VDD and the reference ground voltage. The control circuit 14 may detect the node voltage Vm1 from one detection point (also referred to as a first detection point) in the mirror circuit 12.

In an exemplary embodiment, the mirror circuit 13 is connected between the drive voltage VDD and the output voltage Vout. The control circuit 14 may detect the node voltage Vm2 from one detection point (also referred to as a second detection point) in the mirror circuit 13.

In an exemplary embodiment, the mirror circuit 12 may be configured to detect whether there is an overcurrent in the current flowing through the load switch 11 in a state that the voltage difference $\Delta V$ between the two terminals of the load switch 11 is within the first voltage region. Moreover, the mirror circuit 13 may be configured to detect whether there is an overcurrent in the current flowing through the load switch 11 in a state that the voltage difference $\Delta V$ between the two terminals of the load switch 11 is within the second voltage region. When at least one of the mirror circuits 12 and 13 detects an overcurrent, the control circuit 14 may control the load switch 11 to start a power-off protection mechanism to perform the overcurrent protection.

In an exemplary embodiment, via a dual-loop overcurrent protection mechanism including the mirror circuits 12 and 13, the voltage range corresponding to the current flowing through the load switch 11 may be completely covered. Moreover, compared with the traditional method of directly monitoring the voltage difference between the two terminals of the parasitic metal of the load switch 11 to detect overcurrent, the dual-loop overcurrent protection mechanism provided by an exemplary embodiment of the invention may also adopt a simple circuit architecture to effectively improve the efficiency of overcurrent detection and protection.

Figure 2:
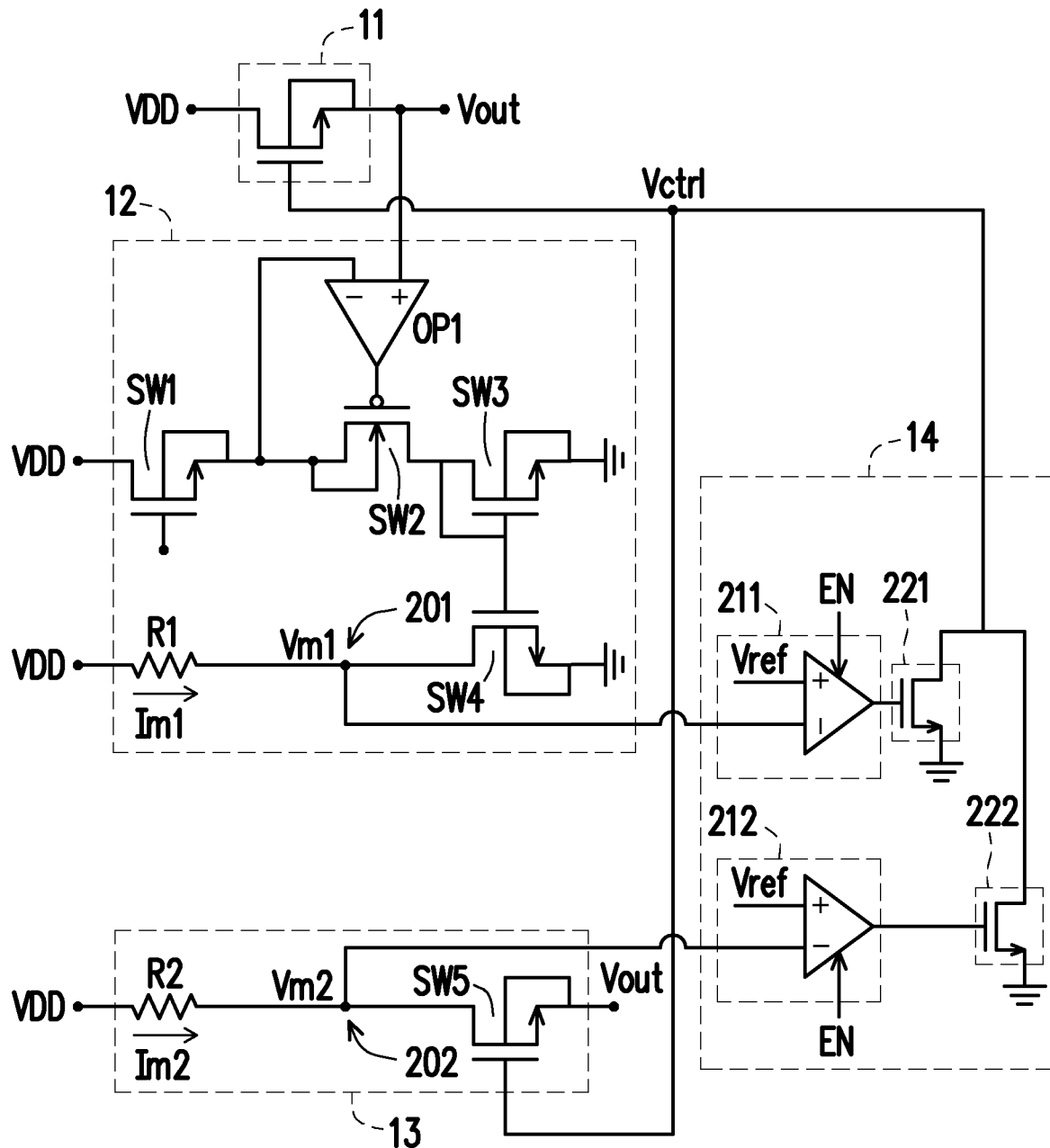
FIG. 2 is a schematic diagram of an overcurrent protection circuit shown according to an exemplary embodiment of the invention.

FIG. 2 is a schematic diagram of an overcurrent protection circuit shown according to an exemplary embodiment of the invention. Please refer to FIG. 2, the load switch 11 may include at least one switch element. For example, the switch element may include a semiconductor element such as a metal-oxide semiconductor field-effect transistor or a bipolar junction transistor (BJT), but the invention is not limited thereto. The at least one switch element may cut off the current path between the two terminals of the load switch 11 (that is, the drive voltage VDD and the output voltage Vout) in response to a control voltage Vctrl.

The mirror circuit 12 includes a current mirror circuit (also referred to as a first current mirror circuit). The first current mirror circuit is connected to the load switch 11 and configured to generate a mirror current (also referred to as a first mirror current) Im1 according to the current flowing through the load switch 11. For example, the first current mirror circuit may include a differential amplifier OP1 and transistors SW1 to SW4. Refer to FIG. 2 for the connection mode of the differential amplifier OP1 and the transistors SW1 to SW4, but the invention is not limited thereto. The first current mirror circuit may reflect the current flowing through the load switch 11 into the mirror circuit 12 to generate the mirror current Im1. It should be noted that a detection point 201 may be configured to detect the mirror current Im1 and/or the node voltage Vm1. For example, the detection point 201 may be located or connected between the drive voltage VDD and the reference ground voltage, as shown in FIG. 2.

The mirror circuit 13 also includes a current mirror circuit (also referred to as a second current mirror circuit). The circuit structure of the second current mirror circuit may be the same as or different from the circuit structure of the first current mirror circuit. The second current mirror circuit is connected to the load switch 11 and configured to generate a mirror current Im2 according to the current flowing through the load switch 11. For example, the second current mirror circuit may include a transistor SW5. For example, the transistor SW5 may be connected between the drive voltage VDD and the output voltage Vout. The second current mirror circuit may reflect the current flowing through the load switch 11 into the mirror circuit 13 to generate the mirror current Im2. It should be noted that a detection point 202 may be configured to detect the mirror current Im2 and/or the node voltage Vm2. For example, the detection point 202 may be located or connected between the drive voltage VDD and the voltage Vout, as shown in FIG. 2.

In an exemplary embodiment, the mirror circuit 12 further includes an impedance element R1. The impedance element R1 may be connected between the drive voltage VDD and the first current mirror circuit (or the transistor SW4), as shown in FIG. 2. The impedance element R1 may generate the node voltage Vm1 at the detection point 201 in response to the mirror current Im1.

In an exemplary embodiment, the mirror circuit 13 further includes an impedance element R2. The impedance element R2 may be connected between the drive voltage VDD and the second current mirror circuit (or the transistor SW5), as shown in FIG. 2. The impedance element R2 may generate the node voltage Vm2 at the detection point 202 in response to the mirror current Im2.

The control circuit 14 may include a comparator (also referred to as a first comparator) 211, a comparator (also referred to as a second comparator) 212, a switch element (also referred to as a first switch element) 221, and a switch element (also referred to as a second switch element) 222. The comparator 211 may be connected to the first current mirror circuit (for example, the detection point 201) and configured to compare the node voltage Vm1 with a reference voltage Vref. The comparator 211 may output a signal reflecting the voltage difference (also referred to as a first voltage difference) between the node voltage Vm1 and the reference voltage Vref. The switch element 221 may be connected to the output terminal of the comparator 211 and the load switch 11. In response to the voltage difference between the node voltage Vm1 and the reference voltage Vref being greater than a threshold value (also referred to as a first threshold value), the switch element 221 may be turned on and output the control voltage Vctrl to the load switch 11. In other words, the first threshold value may be configured to control whether the switch element 221 is turned on. The control voltage Vctrl may control the load switch 11 to cut off the current path between the two terminals of the load switch 11.

Moreover, the comparator 212 may be connected to the second current mirror circuit (or the detection point 202) and configured to compare the node voltage Vm2 with the reference voltage Vref. The comparator 212 may output a signal reflecting the voltage difference (also referred to as a second voltage difference) between the node voltage Vm2 and the reference voltage Vref. The switch element 222 may be connected to the output terminal of the comparator 212 and the load switch 11. In response to the voltage difference between the node voltage Vm2 and the reference voltage Vref being greater than a threshold value (also referred to as a second threshold value), the switch element 222 may be turned on and output the control voltage Vctrl to the load switch 11. In other words, the second threshold value may be configured to control whether the switch element 222 is turned on.

In an exemplary embodiment, the comparator(s) 211 and/or 212 may receive an enabling signal EN. The enabling signal EN may be configured to enable the comparator(s) 211 and/or 212. For example, in a state that the enabling signal EN is not received, the comparator(s) 211 and/or 212 may be turned off to reduce power consumption. When the enabling signal EN is received, the comparator 211 may be started in response to the enabling signal EN and start to compare the node voltage Vm1 with the reference voltage Vref. Similarly, when the enabling signal EN is received, the comparator 212 may be started in response to the enabling signal EN and start to compare the node voltage Vm2 with the reference voltage Vref.

Figure 3:
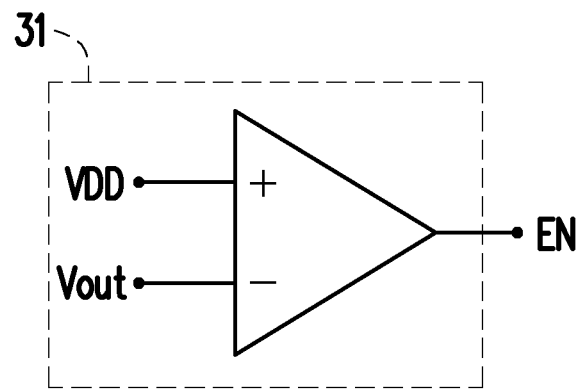
FIG. 3 is a schematic diagram of an enabling circuit shown according to an exemplary embodiment of the invention.

FIG. 3 is a schematic diagram of an enabling circuit shown according to an exemplary embodiment of the invention. Please refer to FIG. 3, an enabling circuit 31 may be included in the overcurrent protection circuit 10 of FIG. 1 or FIG. 2. For example, the enabling circuit 31 may be connected to the comparator 211 and the comparator 212 of FIG. 2. The enabling circuit 31 may send the enabling signal EN to the comparator 211 and/or the comparator 212 in response to the current flowing through the load switch 11 being higher than one start value. For example, the enabling circuit 31 may compare the drive voltage VDD with the output voltage Vout (that is, the voltage between the two terminals of the load switch 11) and obtain the voltage difference between the two terminals of the load switch 11. If the voltage difference is greater than a preset value, it means that the current flowing through the load switch 11 is higher than the start value. At this time, the enabling circuit 31 may send the enabling signal EN to the comparator 211 and/or the comparator 212. In an exemplary embodiment, the enabling circuit 31 may include a differential amplifier.

In an exemplary embodiment, the reference voltage Vref may be generated according to the drive voltage VDD. For example, the reference voltage Vref may be positively related to the drive voltage VDD.

Figure 4:
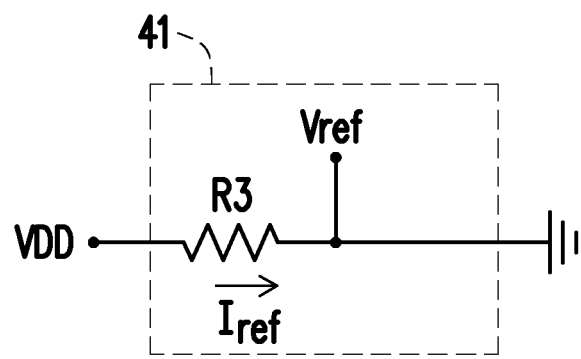
FIG. 4 is a schematic diagram of a reference voltage generating circuit shown according to an exemplary embodiment of the invention.

FIG. 4 is a schematic diagram of a reference voltage generating circuit shown according to an exemplary embodiment of the invention. Please refer to FIG. 4, a reference voltage generating circuit 41 may be included in the overcurrent protection circuit 10 of FIG. 1 or FIG. 2. The reference voltage generating circuit 41 may be configured to generate the reference voltage Vref according to the drive voltage VDD. For example, the reference voltage generating circuit 41 may include an impedance element R3. The impedance element R3 may be connected between the drive voltage VDD and the reference ground voltage. The impedance element R3 may generate the reference voltage Vref according to a reference current Iref flowing through the impedance element R3. The reference voltage Vref may be provided to the comparators 211 and 212 of FIG. 2.

It should be noted that the arrangement and connection methods of all circuit modules in the overcurrent protection circuit 10 mentioned in the above exemplary embodiments are only examples, and are not intended to limit the invention. In some exemplary embodiments, the arrangement and connection methods of all circuit modules in the overcurrent protection circuit 10 may both be adjusted according to practical requirements. Moreover, in some exemplary embodiments, more useful circuit modules and/or electronic elements may be added to the overcurrent protection circuit 10 or configured to replace specific circuit modules and/or electronic elements in the overcurrent protection circuit 10, depending on practical requirements.

In an exemplary embodiment, the overcurrent protection circuit 10 mentioned in the above exemplary embodiments may be disposed in a memory storage device. However, in another exemplary embodiment, the overcurrent protection circuit 10 may also be disposed in other types of electronic devices, and is not limited to a memory storage device.

In an exemplary embodiment, a memory storage device (also referred to as a memory storage system) includes a rewritable non-volatile memory module and a controller (also referred to as a control circuit). The memory storage device is generally used with a host system, such that the host system may write data into the memory storage device or read data from the memory storage device.

Figure 5:
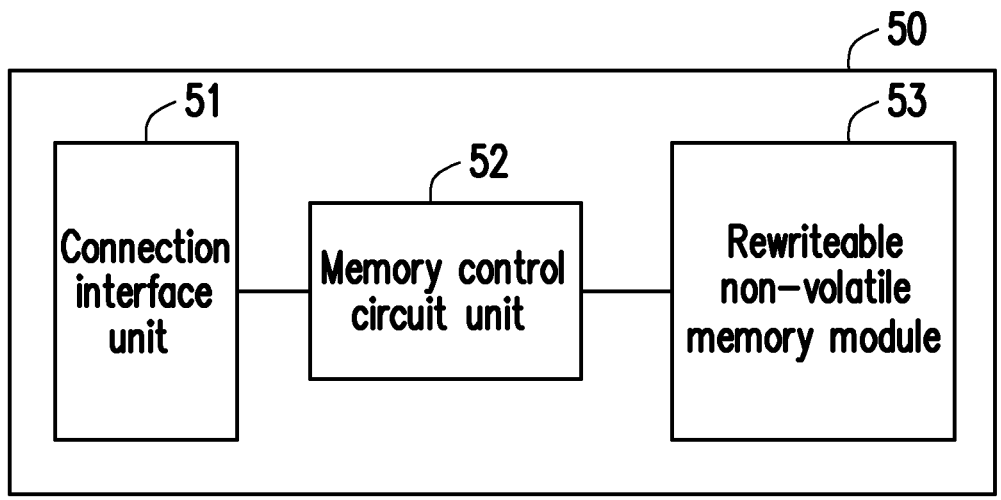
FIG. 5 is a schematic diagram of a memory storage device shown according to an exemplary embodiment of the invention.

FIG. 5 is a schematic diagram of a memory storage device shown according to an exemplary embodiment of the invention. Referring to FIG. 5, a memory storage device 50 includes a connection interface unit 51, a memory control circuit unit 52, and a rewritable non-volatile memory module 53. The overcurrent protection circuit 10 mentioned in the above exemplary embodiments may be disposed in the connection interface unit 51, the memory control circuit unit 52, and/or the rewritable non-volatile memory module 53.

The connection interface unit 51 is configured to connect the memory storage device 50 to a host system. The memory storage device 50 may communicate with the host system via the connection interface unit 51. In an exemplary embodiment, the connection interface unit 51 is compatible with the Peripheral Component Interconnect Express (PCI Express) standard. However, it should be understood that, the invention is not limited thereto, and the connection interface unit 51 may also be compatible with the Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 51 may be sealed in a chip with the memory control circuit unit 52. Alternatively, the connection interface unit 51 is disposed outside of a chip containing the memory control circuit unit 52.

The memory control circuit unit 52 is configured to execute a plurality of logic gates or control commands implemented in a hardware form or in a firmware form. The memory control circuit unit 404 also performs operations such as writing, reading, and erasing data in the rewritable non-volatile memory storage module 53 according to the commands of the host system.

The rewritable non-volatile memory module 53 is connected to the memory control circuit unit 52 and configured to store data written by the host system. The rewritable non-volatile memory module 53 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 53 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 53 has a plurality of storage statuses. Which storage status one memory cell belongs to may be determined via the application of a read voltage, so as to obtain one or a plurality of bits stored by the memory cell.

In the present exemplary embodiment, the memory cells of the rewritable non-volatile memory module 53 form a plurality of physical programming units, and these physical programming units form a plurality of physical erasing units. Specifically, the memory cells on the same word line form one or a plurality of physical programming units. If each memory cell may store two or more bits, then the physical programming units on the same word line may at least be classified into lower physical programming units and upper physical programming units. For example, the least significant bit (LSB) of a memory cell belongs to the lower physical programming unit, and the most significant bit (MSB) of a memory cell belongs to the upper physical programming unit. Generally, in an MLC NAND-type flash memory, the write speed of the lower physical programming unit is greater than the write speed of the upper physical programming unit, and/or the reliability of the lower physical programming unit is greater than the reliability of the upper physical programming unit.

In the present exemplary embodiment, the physical programming unit is the smallest unit of programming. That is, the physical programming unit is the smallest unit of data writing. For example, the physical programming unit is a physical page or a physical sector. If the physical programming unit is a physical page, then the physical programming unit generally includes a data bit area and a redundant bit area. The data bit area contains a plurality of physical pages configured to store user data, and the redundant bit area is configured to store system data (for example, management data such as an ECC). In the present exemplary embodiment, the data bit area contains 32 physical pages, and the size of one physical sector is 512 bytes (B). However, in other exemplary embodiments, the data bit area may also contain 8, 16, or a greater or lesser number of physical pages, and the size of each of the physical pages may also be greater or smaller. Moreover, the physical erasing unit is the smallest unit of erasing. That is, each of the physical erasing units contains the smallest number of memory cells erased together. For example, the physical erasing unit is a physical block.

Figure 6:
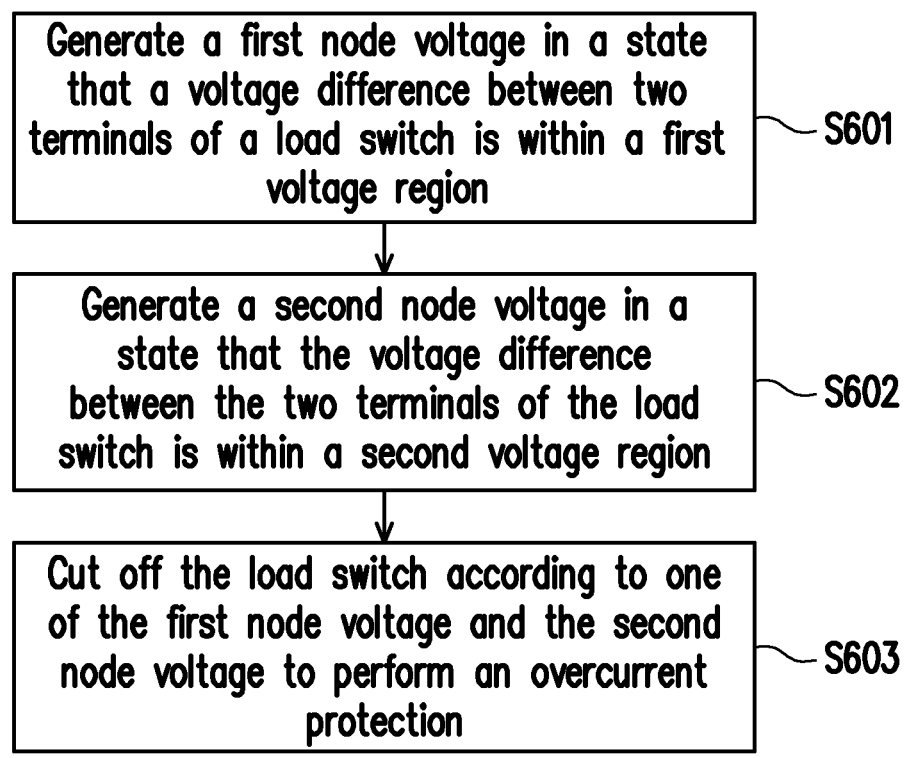
FIG. 6 is a flowchart of an overcurrent protection method shown according to an exemplary embodiment of the invention.

FIG. 6 is a flowchart of an overcurrent protection method shown according to an exemplary embodiment of the invention. Referring to FIG. 6, in step S601, a first node voltage is generated in a state that a voltage difference between two terminals of a load switch is within a first voltage region. In step S602, a second node voltage is generated in a state that the voltage difference between the two terminals of the load switch is within a second voltage region, and the first voltage region is different from the second voltage region. In step S603, the load switch is cut off according to at least one of the first node voltage and the second node voltage to perform an overcurrent protection.

It should be noted that, each step in FIG. 6 is described in detail above, and is therefore not repeated herein. Each step in FIG. 6 may be implemented as a plurality of program codes or circuits, and the invention is not limited thereto. Moreover, the method of FIG. 6 may be used with the above exemplary embodiments, and may also be used alone, and the invention is not limited thereto.

Based on the above, an exemplary embodiment of the invention provides a dual-loop overcurrent protection mechanism including a first mirror circuit and a second mirror circuit, so that the voltage range corresponding to the current flowing through the load switch may be completely covered. Moreover, compared to the traditional method of detecting overcurrent by monitoring the voltage difference between the two terminals of the parasitic metal, the dual-loop overcurrent protection mechanism may also adopt a simple circuit architecture to effectively improve the efficiency of overcurrent detection and protection.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. An overcurrent protection circuit, comprising:
a load switch, wherein two terminals thereof are respectively connected to a first voltage and a second voltage;
a first mirror circuit connected to the load switch;
a second mirror circuit connected to the load switch;
a control circuit connected to the load switch, the first mirror circuit, and the second mirror circuit,
wherein the first mirror circuit is configured to detect whether there is an overcurrent in a current flowing through the load switch in a state that a voltage difference between the two terminals of the load switch is within a first voltage region,
the first mirror circuit is configured to generate a first node voltage in the state that the voltage difference between the two terminals of the load switch is within the first voltage region,
the second mirror circuit is configured to detect whether there is the overcurrent in the current flowing through the load switch in a state that the voltage difference between the two terminals of the load switch is within a second voltage region,
the second mirror circuit is configured to generate a second node voltage in the state that the voltage difference between the two terminals of the load switch is within the second voltage region,
the control circuit is configured to cut off the load switch according to at least one of the first node voltage and the second node voltage to perform an overcurrent protection, and
the first voltage region covers a portion of a voltage range between a drive voltage and a reference ground voltage, the second voltage region covers an another portion of the voltage range between the drive voltage and the reference ground voltage, and the first voltage region and the second voltage region are at least partially overlapped,
wherein the first mirror circuit comprises:
a first current mirror circuit connected to the load switch, wherein the second mirror circuit comprises:
a second current mirror circuit connected to the load switch
wherein the first current mirror circuit is configured to generate a first mirror current according to the current flowing through the load switch,
wherein the second current mirror circuit is configured to generate a second mirror current according to the current flowing through the load switch.

2. The overcurrent protection circuit of claim 1, wherein the first voltage region and the second voltage region are at least partially not overlapped.

3. The overcurrent protection circuit of claim 1, wherein the operation of the control circuit cutting off the load switch according to one of the first node voltage and the second node voltage comprises:
sending a control signal to the load switch in response to a voltage difference between one of the first node voltage and the second node voltage and a reference voltage being greater than a threshold value to cut off the load switch via the control signal.

4. The overcurrent protection circuit of claim 1, wherein the first mirror circuit is configured to generate the first mirror current flowing through a first detection point in the state that the voltage difference between the two terminals of the load switch is within the first voltage region, the second mirror circuit is configured to generate the second mirror current flowing through a second detection point in the state that the voltage difference between the two terminals of the load switch is within the second voltage region, the first detection point is configured to detect the first node voltage, and the second detection point is configured to detect the second node voltage.

5. The current overprotection circuit of claim 4, wherein the first detection point is connected between the first voltage and a reference ground voltage, and the second detection point is connected between the first voltage and the second voltage.

6. The overcurrent protection circuit of claim 4, wherein the first mirror circuit comprises a first impedance element, and the second mirror circuit comprises a second impedance element, the first impedance element is connected to the first detection point and configured to generate the first node voltage according to the first mirror current; and the second impedance element is connected to the second detection point and configured to generate the second node voltage according to the second mirror current.

7. The overcurrent protection circuit of claim 4, wherein the control circuit comprises:

a first comparator connected to the first mirror circuit and configured to compare the first node voltage with a reference voltage; and a second comparator connected to the second mirror circuit and configured to compare the second node voltage with the reference voltage.

8. The overcurrent protection circuit of claim 7, wherein the control circuit further comprises:

a first switch element connected to the first comparator and the load switch and configured to generate a control signal in response to a first voltage difference between the first node voltage and the reference voltage being greater than a first threshold value, wherein the control signal is configured to cut off the load switch; and a second switch element connected to the second comparator and the load switch and configured to generate the control signal in response to a second voltage difference between the second node voltage and the reference voltage being greater than a second threshold value.

9. The overcurrent protection circuit of claim 7, wherein the control circuit further comprises:

an enabling circuit connected to the first comparator and the second comparator, wherein the enabling circuit is configured to send an enabling signal to the first comparator and the second comparator in response to the current flowing through the load switch being higher than a start value.

10. A memory storage device, comprising:
a connection interface unit configured to be connected to a host system;
a rewritable non-volatile memory module;
a memory control circuit unit connected to the connection interface unit and the rewritable non-volatile memory module; and an overcurrent protection circuit disposed in the connection interface unit, the rewritable non-volatile memory module, or the memory control circuit unit, wherein the overcurrent protection circuit is configured to:

detect whether there is an overcurrent in a current flowing through a load switch in a state that a voltage difference between the two terminals of the load switch is within a first voltage region;

generate a first node voltage in the state that the voltage difference between two terminals of the load switch is within the first voltage region, wherein the two terminals of the load switch are respectively connected to a first voltage and a second voltage;

detect whether there is the overcurrent in the current flowing through the load switch in a state that the voltage difference between the two terminals of the load switch is within a second voltage region;

generate a second node voltage in the state that the voltage difference between the two terminals of the load switch is within the second voltage region; and cut off the load switch according to at least one of the first node voltage and the second node voltage to perform an overcurrent protection, wherein the first voltage region covers a portion of a voltage range between a drive voltage and a reference ground voltage, the second voltage region covers an another portion of the voltage range between the drive voltage and the reference ground voltage, and the first voltage region and the second voltage region are at least partially overlapped, wherein the overcurrent protection circuit comprises:
a first mirror circuit connected to the load switch; and
a second mirror circuit connected to the load switch,
wherein the first mirror circuit comprises:
a first current mirror circuit connected to the load switch and configured to generate a first mirror current according to the current flowing through the load switch,
wherein the second mirror circuit comprises:
a second current mirror circuit connected to the load switch and configured to generate a second mirror current according to the current flowing through the load switch.

11. The memory storage device of claim 10, wherein the first voltage region and the second voltage region are at least partially not overlapped.

12. The memory storage device of claim 10, wherein the operation of the overcurrent protection circuit cutting off the load switch according to one of the first node voltage and the second node voltage comprises:

sending a control signal to the load switch in response to a voltage difference between one of the first node voltage and the second node voltage and a reference voltage being greater than a threshold value to cut off the load switch via the control signal.

13. The memory storage device of claim 10, wherein
the first mirror circuit configured to generate the first mirror current flowing through a first detection point in the state that the voltage difference between the two terminals of the load switch is within the first voltage region; and the second mirror circuit configured to generate the second mirror current flowing through a second detection point in the state that the voltage difference between the two terminals of the load switch is within the second voltage region, wherein the first detection point is configured to detect the first node voltage, and the second detection point is configured to detect the second node voltage.

14. The memory storage device of claim 13, wherein the first detection point is connected between the first voltage and a reference ground voltage, and the second detection point is connected between the first voltage and the second voltage.

15. The memory storage device of claim 13, wherein the first mirror circuit comprises a first impedance element, and the second mirror circuit comprises a second impedance element, the first impedance element is connected to the first detection point and configured to generate the first node voltage according to the first mirror current; and the second impedance element is connected to the second detection point and configured to generate the second node voltage according to the second mirror current.

16. The memory storage device of claim 13, wherein the overcurrent protection circuit further comprises:

a first comparator connected to the first mirror circuit and configured to compare the first node voltage with a reference voltage; and a second comparator connected to the second mirror circuit and configured to compare the second node voltage with the reference voltage.

17. The memory storage device of claim 16, wherein the overcurrent protection circuit further comprises:

a first switch element connected to the first comparator and the load switch and configured to generate a control signal in response to a first voltage difference between the first node voltage and the reference voltage being greater than a first threshold value, wherein the control signal is configured to cut off the load switch; and a second switch element connected to the second comparator and the load switch and configured to generate the control signal in response to a second voltage difference between the second node voltage and the reference voltage being greater than a second threshold value.

18. The memory storage device of claim 16, wherein the overcurrent protection circuit further comprises:

an enabling circuit connected to the first comparator and the second comparator, wherein the enabling circuit is configured to send an enabling signal to the first comparator and the second comparator in response to the current flowing through the load switch being higher than a start value.

19. An overcurrent protection method, configured to control a load switch, the overcurrent protection method comprising:

detecting whether there is an overcurrent in a current flowing through a load switch in a state that a voltage difference between the two terminals of the load switch is within a first voltage region;

generating a first node voltage in the state that the voltage difference between two terminals of the load switch is within the first voltage region, wherein the two terminals of the load switch are respectively connected to a first voltage and a second voltage;

generating a first mirror current according to the current flowing through the load switch via a first current mirror circuit of a first mirror circuit;

detecting whether there is the overcurrent in the current flowing through the load switch in a state that the voltage difference between the two terminals of the load switch is within a second voltage region;

generating a second node voltage in the state that the voltage difference between the two terminals of the load switch is within the second voltage region;

generating a second mirror current according to the current flowing through the load switch via a second current mirror circuit of a second mirror circuit; and cutting off the load switch according to at least one of the first node voltage and the second node voltage to perform an overcurrent protection, wherein the first voltage region covers a portion of a voltage range between a drive voltage and a reference ground voltage, the second voltage region covers an another portion of the voltage range between the drive voltage and the reference ground voltage, and the first voltage region and the second voltage region are at least partially overlapped.

20. The overcurrent protection method of claim 19, wherein the first voltage region and the second voltage region are at least partially not overlapped.

21. The overcurrent protection method of claim 19, wherein the step of cutting off the load switch according to one of the first node voltage and the second node voltage comprises:

sending a control signal to the load switch in response to a voltage difference between one of the first node voltage and the second node voltage and a reference voltage being greater than a threshold value to cut off the load switch via the control signal.

22. The overcurrent protection method of claim 19, wherein the step of generating the first node voltage in the state that the voltage difference between the two terminals of the load switch is within the first voltage region comprises:

generating the first mirror current flowing through a first detection point via the first mirror circuit in the state that the voltage difference between the two terminals of the load switch is within the first voltage region, and the step of generating the second node voltage in the state that the voltage difference between the two terminals of the load switch is within the second voltage region comprises:

generating the second mirror current flowing through a second detection point via the second current mirror circuit according to a second current, wherein the first detection point is configured to detect the first node voltage, and the second detection point is configured to detect the second node voltage.

23. The current overprotection method of claim 22, wherein the first detection point is connected between the first voltage and a reference ground voltage, and the second detection point is connected between the first voltage and the second voltage.

24. The overcurrent protection method of claim 22, wherein the step of generating the first node voltage in the state that the voltage difference between the two terminals of the load switch is within the first voltage region further comprises:

generating the first node voltage via a first impedance element according to the first mirror current, and the step of generating the second node voltage in the state that the voltage difference between the two terminals of the load switch is within the second voltage region further comprises:

generating the second node voltage via a second impedance element according to the second mirror current.

25. The overcurrent protection method of claim 22, wherein the step of cutting off the load switch according to one of the first node voltage and the second node voltage to perform the overcurrent protection comprises:
    comparing the first node voltage with a reference voltage via a first comparator; and
    comparing the second node voltage with the reference voltage via a second comparator.

26. The overcurrent protection method of claim 25, wherein the step of cutting off the load switch according to one of the first node voltage and the second node voltage to perform the overcurrent protection further comprises:
    generating a control signal via a first switch element in response to a first voltage difference between the first node voltage and the reference voltage being greater than a first threshold value, wherein the control signal is configured to cut off the load switch; and
    generating the control signal via a second switch element in response to a second voltage difference between the second node voltage and the reference voltage being greater than a second threshold value.

27. The overcurrent protection method of claim 25, further comprising:
    sending an enabling signal via an enabling circuit to the first comparator and the second comparator in response to the current flowing through the load switch being higher than a start value.

* * * * *